(12) United States Patent
Cannon et al.

(10) Patent No.: US 8,754,701 B2
(45) Date of Patent: Jun. 17, 2014

(54) INTERLEAVED TRANSIENT FILTER

(71) Applicant: The Boeing Company, Seal Beach, CA (US)

(72) Inventors: Ethan Cannon, Seal Beach, CA (US); Manuel F. Cabanas-Holmen, Seal Beach, CA (US); Salim A. Rabaa, Seal Beach, CA (US)

(73) Assignee: The Boeing Company, Chicgo, IL (US)

( * ) Notice: Subject to any disclaimer, the term of this patent is extended or adjusted under 35 U.S.C. 154(b) by 0 days.

(21) Appl. No.: 13/673,438

(22) Filed: Nov. 9, 2012

(65) Prior Publication Data

US 2014/0132332 A1    May 15, 2014

(51) Int. Cl.
*H03K 17/16* (2006.01)

(52) U.S. Cl.
USPC .......................................... 327/391; 327/144

(58) Field of Classification Search
USPC ................... 327/144, 197–202, 391; 365/156, 365/189.05, 194; 326/9, 12, 13, 93, 95, 98
See application file for complete search history.

(56) References Cited

U.S. PATENT DOCUMENTS

| | | | |
|---|---|---|---|
| 5,867,448 A * | 2/1999 | Mann ....................... | 365/233.14 |
| 6,326,809 B1 | 12/2001 | Gambles et al. | |
| 7,078,979 B2 * | 7/2006 | Dally et al. ...................... | 331/57 |
| 7,928,770 B1 * | 4/2011 | Bellis et al. ...................... | 326/96 |
| 2001/0038304 A1 | 11/2001 | Waldie et al. | |
| 2007/0028157 A1 | 2/2007 | Drake et al. | |
| 2007/0132496 A1 | 6/2007 | Kuboyama et al. | |
| 2008/0115023 A1 | 5/2008 | Carlson | |
| 2009/0204933 A1 | 8/2009 | Rezgui | |
| 2011/0025372 A1* | 2/2011 | Cabanas-Holmen et al. .... | 326/9 |

FOREIGN PATENT DOCUMENTS

EP    2280346    2/2011

OTHER PUBLICATIONS

M. Maymandi-Nejad and M. Sachdev "A Digitally Programmable Delay Element: Design and Analysis" IEEE Trans. VLSI Systems, vol. 11, No. 5, pp. 871-878, Oct. 2003.
M. Saint-Laurent and M. Swaminathan "A Digitally Adjustable Resistor for Path Delay Characterization in High-Frequency Microprocessors" 2001 Southwest Symp. on Mixed-Signal Design (SSMDS) pp. 61-64.

* cited by examiner

*Primary Examiner* — Lincoln Donovan
*Assistant Examiner* — Diana J Cheng
(74) *Attorney, Agent, or Firm* — Weiss & Moy, P.C.

(57) ABSTRACT

An interleaved filter circuit has a delay element configured to receive an input signal. An interleaved output buffer has a first input which receives the input signal and a second input which receives the output of the delay element. An output of the interleaved output buffer is driven when the first input and the second input are at a same logic level.

19 Claims, 8 Drawing Sheets

INTERLEAVED TRANSIENT FILTER

BACKGROUND

Embodiments of this disclosure relate generally to a filter, and more particularly, to an interleaved transient filter that removes voltage transients on its input due to radiation or due to cross talk whose duration are less than a time delay of a delay element in the filter.

Many of today's commercial integrated circuit (IC) devices may not be utilized in certain situations due to radiation induced transient pulses, single particle strikes on constituent logic gates, crosstalk or other Single Event Transients (SETs). The transients may degrade the performance or cause the failure of these IC devices to function properly.

Some IC devices may use fixed delay filters that may remove voltage transients from single particle strikes and from crosstalk. The fixed delay filters may be Resistor Capacitor (RC) filters, standard C-gate based fixed-delay filters where the C-gate is a source of voltage transients, or large Single Event Transient (SET) hardened C-gate based fixed-delay filters, where the C-gate has a very large drive strength to mitigate transient generation.

Each of the above type of fixed time delay filters may have certain issues. For example, RC filters may be very large and difficult to implement in modern commercial Complementary Metal-Oxide-Semiconductor (CMOS) technologies. Standard C-gate filters may generate transients at the output of the C-gate filter, which is the input of the logic gate that the C-gate filters are intended to protect. SET hardened C-gates may take too much Application-Specific Integrated Circuit (ASIC) area. Further, the delay of all of the above mentioned filters is generally fixed for a given process, voltage and temperature, and it is generally not possible to change the value of the delay element after fabrication. Further, it is also generally not possible to adjust the delay to get a specified delay, regardless of process, voltage and temperature variations.

Therefore, it would be desirable to provide a system and method that overcomes the above.

SUMMARY

An interleaved filter circuit has a delay element configured to receive an input signal. An interleaved output buffer has a first input which receives the input signal and a second input which receives the output of the delay element. An output of the interleaved output buffer is driven when the first input and the second input are at a same logic level.

An interleaved filter circuit has a delay element having an input signal and an output signal, the output signal of the delay element being at approximately a same level as the input signal after a predetermined amount of time determined by the delay element. An interleaved output buffer is provided and has a first input coupled to the input signal, a second input coupled to the output signal of the delay element, an output buffer output signal being driven when the input signal and the output signal of the delay element are at a same logic level. The interleaved output buffer has a first pair of transistors coupled to the input signal, wherein the first pair of transistors are a first PMOSFET and first NMOSFET and a second pair of transistors coupled to the output of the delay element, wherein the second pair of transistors are a second PMOSFET and a second NMOSFET, wherein the first NMOSFET is interleaved with the second NMOSFET and the first PMOSFET is interleaved with the second PMOSFET.

A method for filtering Single Event Transients (SETs) comprising: providing an output buffer having a first pair of transistors wherein the first pair of transistors are a first PMOSFET and first NMOSFET and a second pair of transistors wherein the second pair of transistors are a second PMOSFET and a second NMOSFET, sending an input signal to the first pair of transistors, sending the input signal which is delayed by a predetermined amount of time to the second pair of transistors, and driving an output buffer output signal when the input signal and the delayed input signal are at a same logic level.

The features, functions, and advantages may be achieved independently in various embodiments of the disclosure or may be combined in yet other embodiments.

BRIEF DESCRIPTION OF THE DRAWINGS

Embodiments of the disclosure will become more fully understood from the detailed description and the accompanying drawings, wherein.

DETAILED DESCRIPTION

Figure 1:
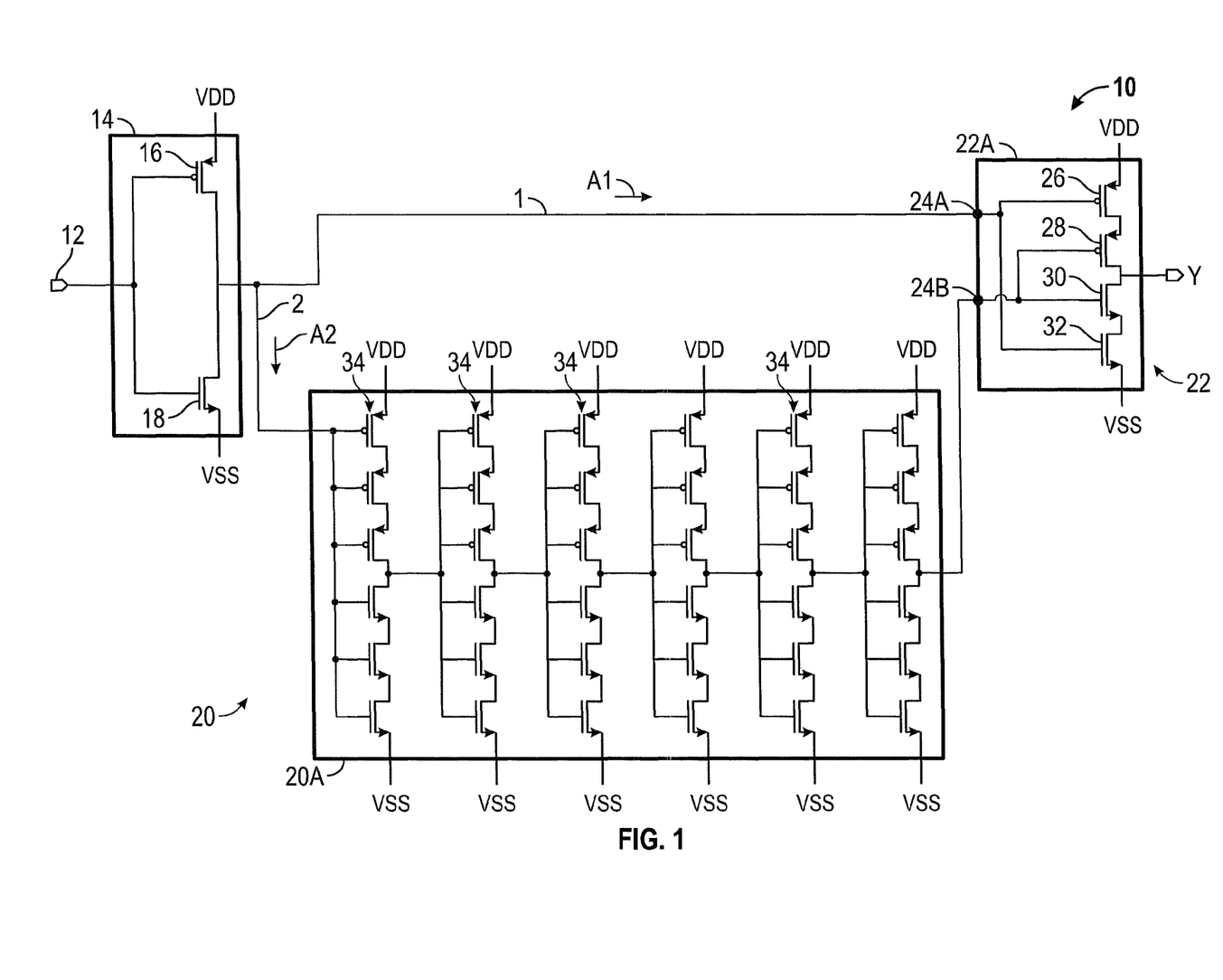
FIG. 1 is a simplified schematic of an interleaved transient filter.
Figure 2:
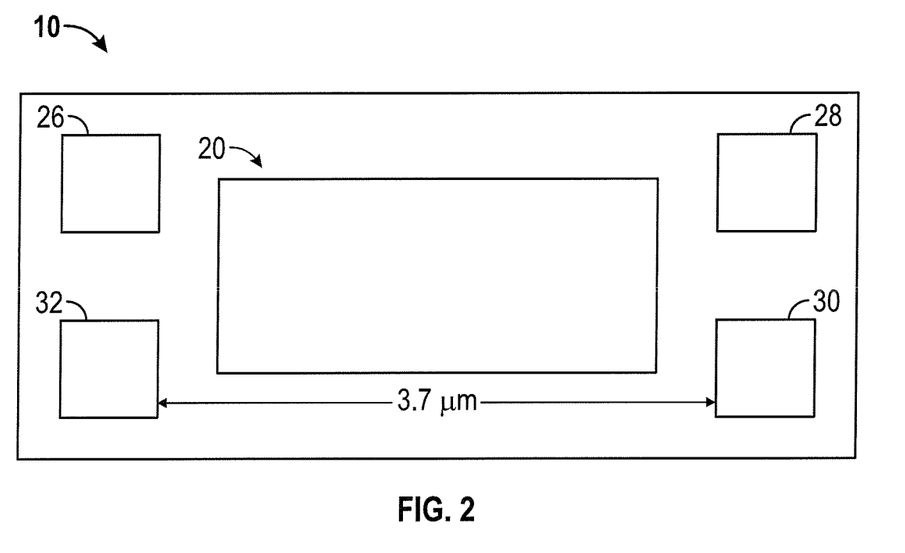
FIG. 2 is a simplified layout showing a position of transistors used in a C-gate for the interleaved transient filter of FIG. 1.

Referring to FIGS. 1 and 2, an interleaved transient filter 10 (hereinafter filter 10) may be described. The filter 10 may be configured to remove voltage transients on an input 12 of the filter 10 due to radiation Single Event Transient (SETs) or due to cross talk whose duration may be less than a delay of a delay element 20 in the filter 10.

The filter 10 may send an input signal A on input 12 to an input buffer 14. In the present embodiment, the input buffer 14 may be formed of a pair of transistors 16 and 18. The pair of transistors 16 and 18 may be complementary MOSFETS. As shown, the transistor 16 may be a P-type transistor such as a P-type MOSFET, while the transistor 18 may be an N-type transistor such as an N-type MOSFET.

When the input signal A is a high signal, transistor 18 may turn on and send the input signal A along two paths, path 1 having signal A1 and path 2 having signal A2. Similarly, when the input signal A is a low signal, transistor 16 may turn on and send the input signal A along two paths, path 1 having signal A1 and path 2 having signal A2. Path 2 may include a delay element 20. The two signals A1 and A2 along path 1 and path 2 respectively may be sent to inputs 24A and 24B of a logic element 22. The logic element 22 may be a C-gate 22A.

When the signals A1 and A2 sent to inputs 24A and 24B of the C-gate 22A match, the C-gate 22A may act as an inverter. When the signals A1 and A2 sent to inputs 24A and 24B of the C-gate 22A do not match, the C-gate 22A may not drive its output (high impedance state), and the output of the C-gate 22A may maintain its current value.

In the embodiment shown, the C-gate 22A may be comprised of two series PMOS transistors 26, 28 and two series NMOS transistors 30, 32. Each input 24A and 24B of the C-gate 22A controls the gate of one PMOS transistor 26 or 28 and one NMOS transistor 30 or 32. In the embodiment shown, the input 24A can control the gate of PMOS transistor 26 and the gate of NMOS transistor 32. The input 24B can control the gate of PMOS transistor 28 and the gate of NMOS transistor 30.

To generate an SET at an output of the filter 10, a radiation particle would generally have to strike either both series NMOS transistors 30, 32, or both series PMOS transistors 26, 28, depending on the input signal A to the filter 10. The C-gate PMOS transistors 26, 28 and NMOS transistors 30, 32 may be interleaved to provide enough separation to mitigate possible SETs occurring when a radiation particle strikes two transistor sites.

Current Silicon-On-Insulator (SOI) technologies may have very thin epitaxial silicon layers on top of the buried oxide (BOX), generally less than 100 nm starting at the 90-nm process node. Consequently, the spacing needed to reduce double-node strikes to an acceptable level may be approximately 0.5 microns, which may be attained by interleaving the PMOS transistors 26, 28 and the NMOS transistors 30, 32 in the C-gate 22A. The delay element 20 may be placed between the interleaved PMOS transistors 26, 28, and between the interleaved NMOS transistors 30, 32 in the C-gate 22A, in order to achieve the desired node spacing without any wasted space.

As may be seen in FIG. 1, a first implementation of the filter 10 may use a delay element 20 which is a fixed delay element 20A. The fixed delay element 20A may be comprised of a plurality of series connected transistor delay circuits 34. The duration of the fixed delay element 20A may be selected during the design phase of an Application Specific Integrated Circuit (ASIC). The delay time may be a function of process, voltage and temperature. For instance, if the ASIC is manufactured in a slow corner the delay may be greater, but commensurate with the type of transients generated by the logic circuits in the ASIC.

Figure 3:
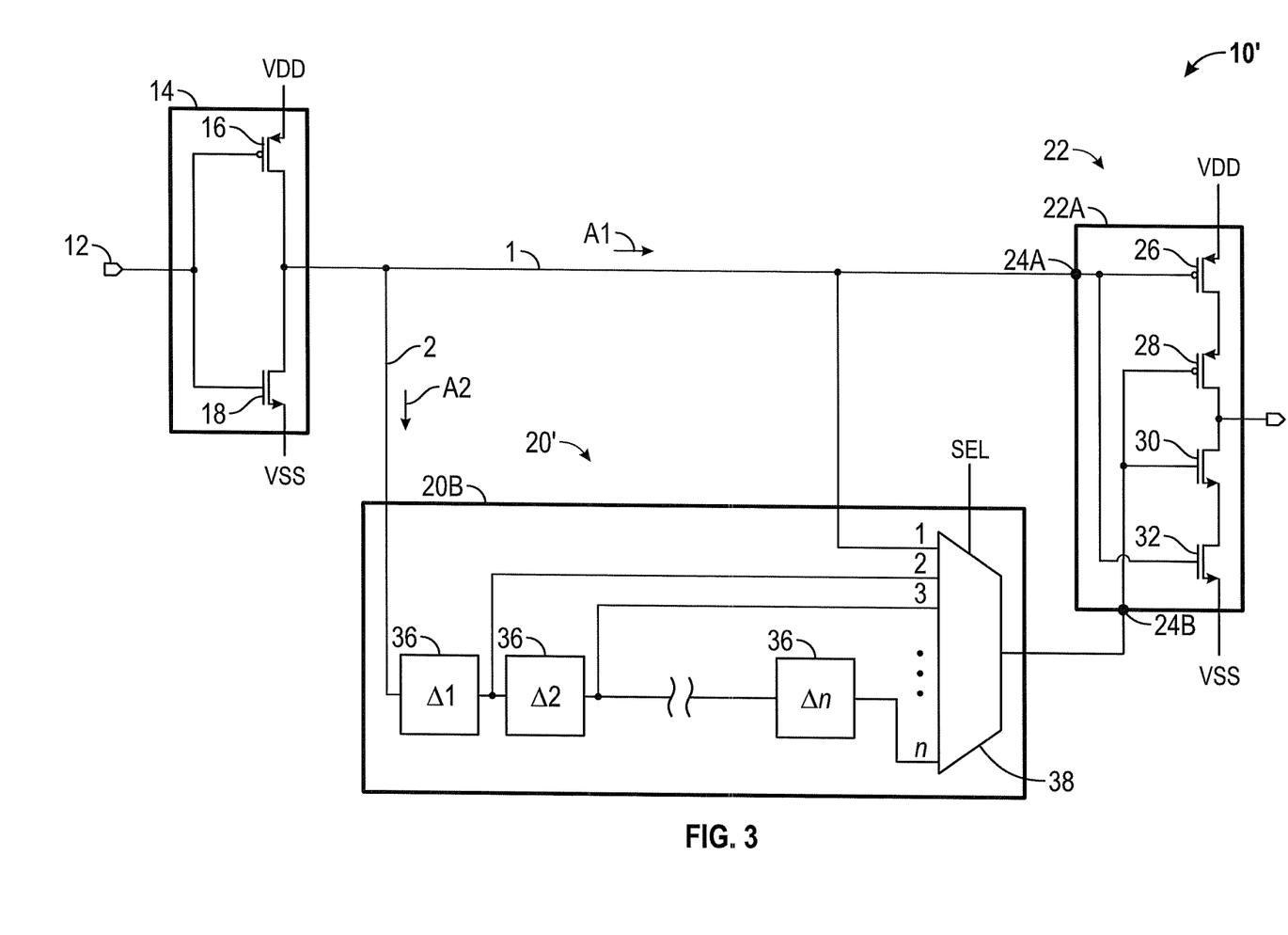
FIG. 3 is another simplified schematic of an interleaved transient filter.
Figure 4:
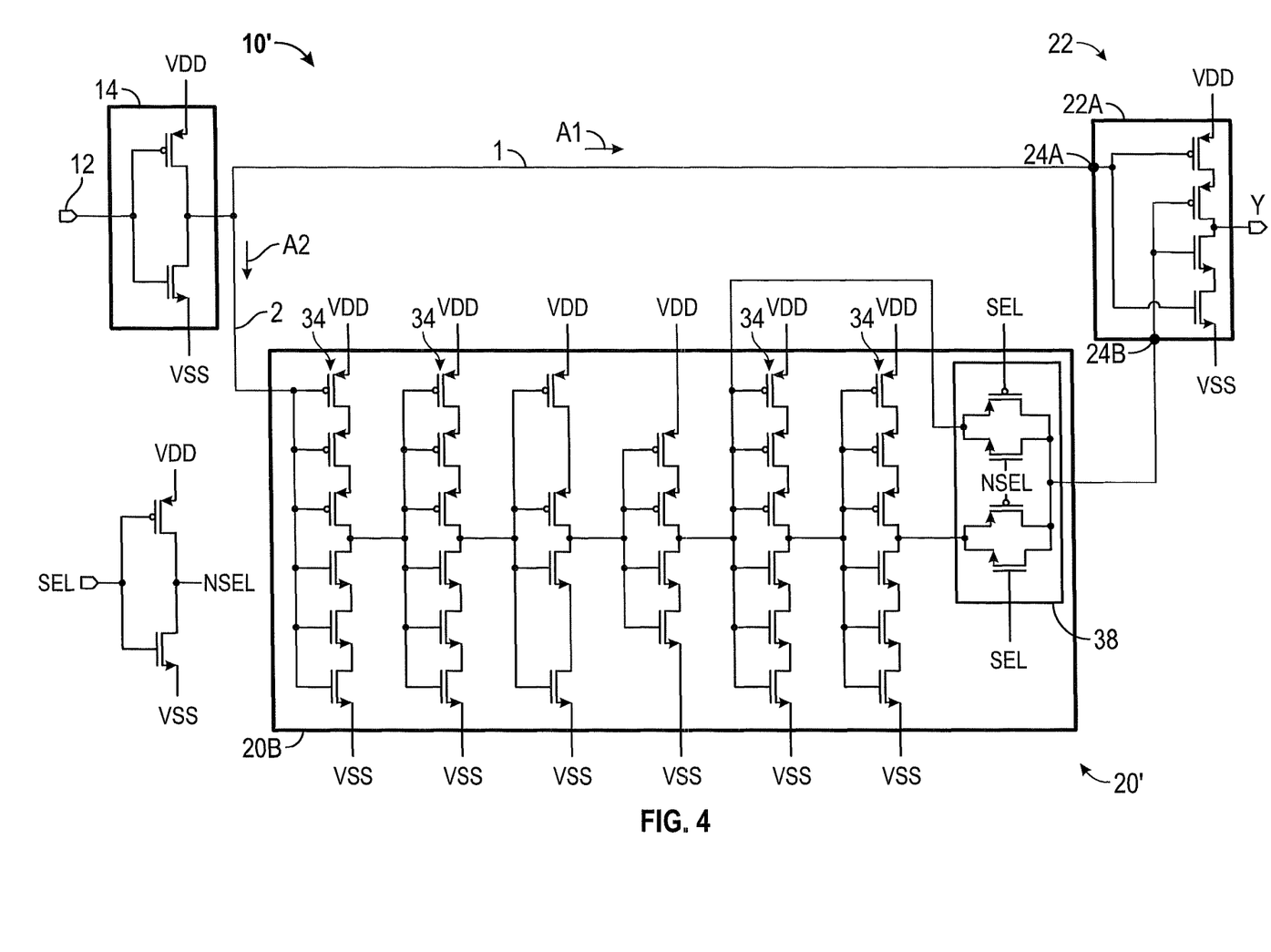
FIG. 4 is a simplified schematic of the interleaved transient filter of FIG. 3, showing one implementation of a delay circuit.
Figure 5:
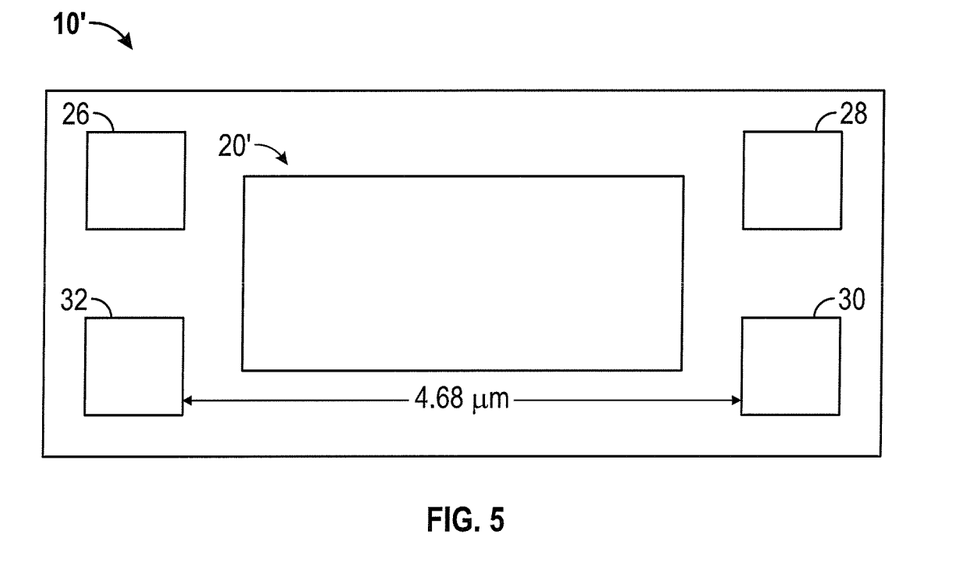
FIG. 5 is a simplified layout showing a position of transistors used in a C-gate for the interleaved transient filter of FIGS. 3 and 4.

Referring now to FIGS. 3-5, a second implementation of the filter 10' may be shown. Like the filter 10, the filter 10' may send an input signal A to an input buffer 14. In the embodiment shown, the input buffer 14 may be formed of a pair of transistors 16 and 18. The pair of transistors 16 and 18 may be complementary MOSFETS. The transistor 16 may be a P-type MOSFET while the transistor 18 may be an N-type MOSFET.

When the input signal A is a high signal, transistor 18 may turn on and send the input signal A along two paths, path 1 having signal A1 and path 2 having signal A2. Similarly, when the input signal A is a low signal, transistor 16 may turn on and send the input signal A along two paths, path 1 having signal A1 and path 2 having signal A2. Path 2 may include a delay element 20'. The two signals A1 and A2 along path 1 and path 2 respectively may be sent to inputs 24A and 24B of a logic element 22. The logic element 22 may be a C-gate 22A.

When the signals A1 and A2 sent to inputs 24A and 24B of the C-gate 22A match, the C-gate 22A may act as an inverter. When the signals A1 and A2 sent to inputs 24A and 24B of the C-gate 22A do not match, the C-gate 22A may not drive its output (high impedance state), and the output of the C-gate 22A may maintain its current value.

In the embodiment shown, the C-gate 22A may be comprised of two series PMOS transistors 26, 28 and two series NMOS transistors 30, 32. Each input 24A and 24B of the C-gate 22A controls the gate of one PMOS transistor 26 or 28 and one NMOS transistor 30 or 32. In the embodiment shown, the input 24A can control the gate of PMOS transistor 26 and the gate of NMOS transistor 32. The input 24B can control the gate of PMOS transistor 28 and the gate of NMOS transistor 30.

To generate an SET at an output of the filter 10', a radiation particle would generally have to strike either both series NMOS transistors 30, 32, or both series PMOS transistors 26, 28, depending on the input signal A to the filter 10'. The C-gate PMOS transistors 26, 28 and NMOS transistors 30, 32 may be interleaved to provide enough separation to mitigate possible SETs occurring when a radiation particle strikes two transistor sites.

As described above, current SOI technologies may have very thin epitaxial silicon layers on top of the buried oxide (BOX), generally less than 100 nm starting at the 90-nm process node, so the spacing needed to reduce double-node strikes to an acceptable level may be approximately 0.5 microns. This may be attained by interleaving the PMOS transistors 26, 28 and the NMOS transistors 30, 32 in the C-gate 22A. Similar to delay element 20, the delay element 20' may also be placed between the interleaved PMOS transistors 26, 28, and between the interleaved NMOS transistors 30, 32 in the C-gate 22A, in order to achieve the desired node spacing without any wasted space.

As may be seen in FIGS. 3 and 4, the delay element 20' is a selectable delay element 20B. The selectable delay element 20B may be comprised of a plurality of fixed delay circuits 36. Each fixed delay circuits 36 may be comprised of series connected transistor delay circuits 34 similar to that shown for the fixed delay element 20A shown in FIG. 1. The duration of each fixed delay circuit 36 may be selected during the design phase of an ASIC. The delay may be a function of process, voltage and temperature.

Each of the fixed delay circuits 36 may be coupled to a multiplexer 38. The fixed delay circuits 36 may be placed serially back to back with the output of each fixed delay circuit 36 coupled to an input of the multiplexer 38 and to the input of the subsequent fixed delay circuit 36. The output of the multiplexer 38 may be connected to the second input 24B of the C-gate 22A. One or more select signals SEL may be sent to the multiplexer 38 and may be used to configure the selectable delay element 20B to a user selected, desired programmable time delay. The select signals SEL may be used to send signals to the multiplexer 38 to select which outputs from the fixed delay circuits 36 are sent to the second input 24B of the C-gate 22A.

Figure 6:
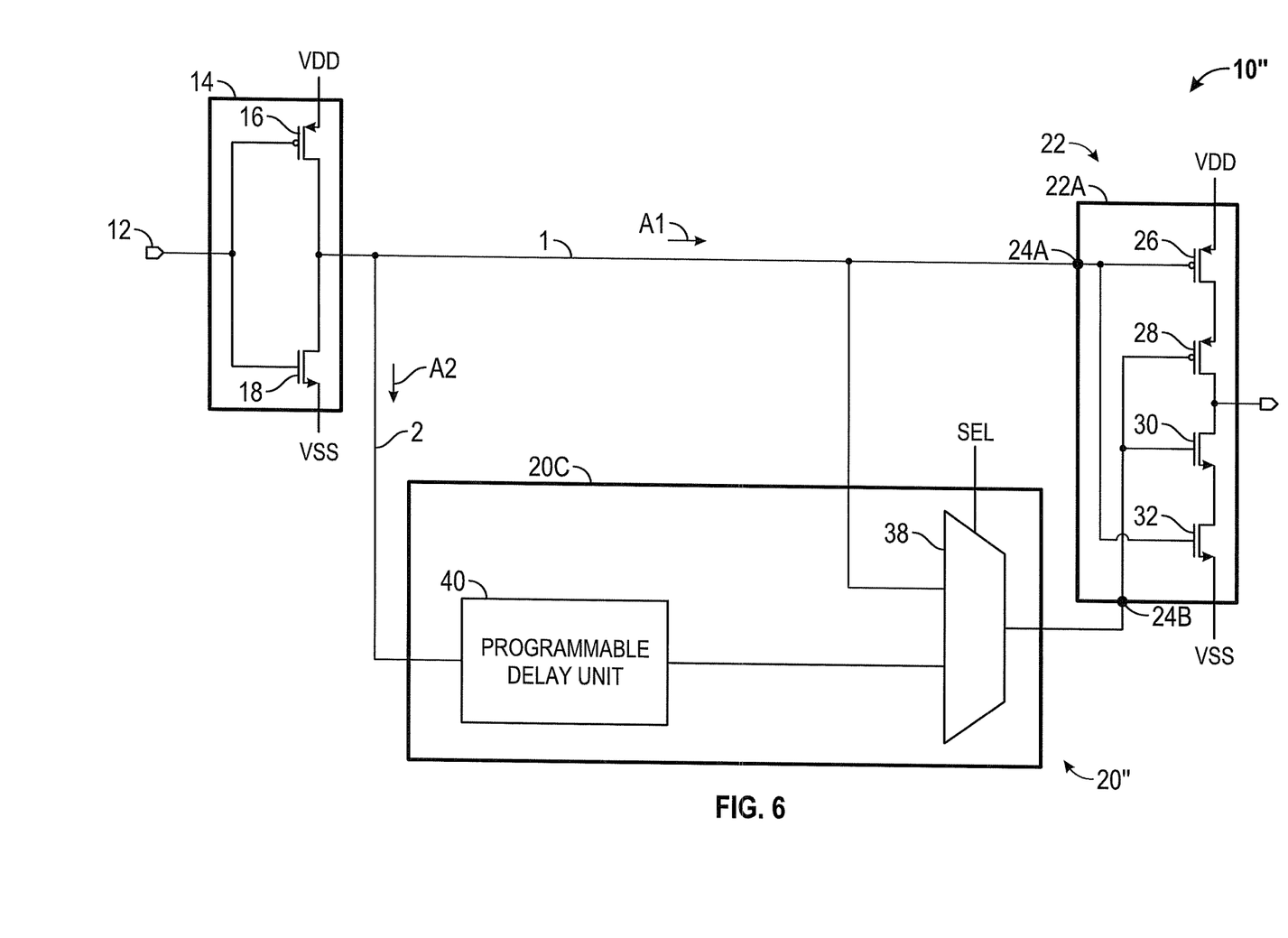
FIG. 6 is another simplified schematic of an interleaved transient filter.
Figure 7:
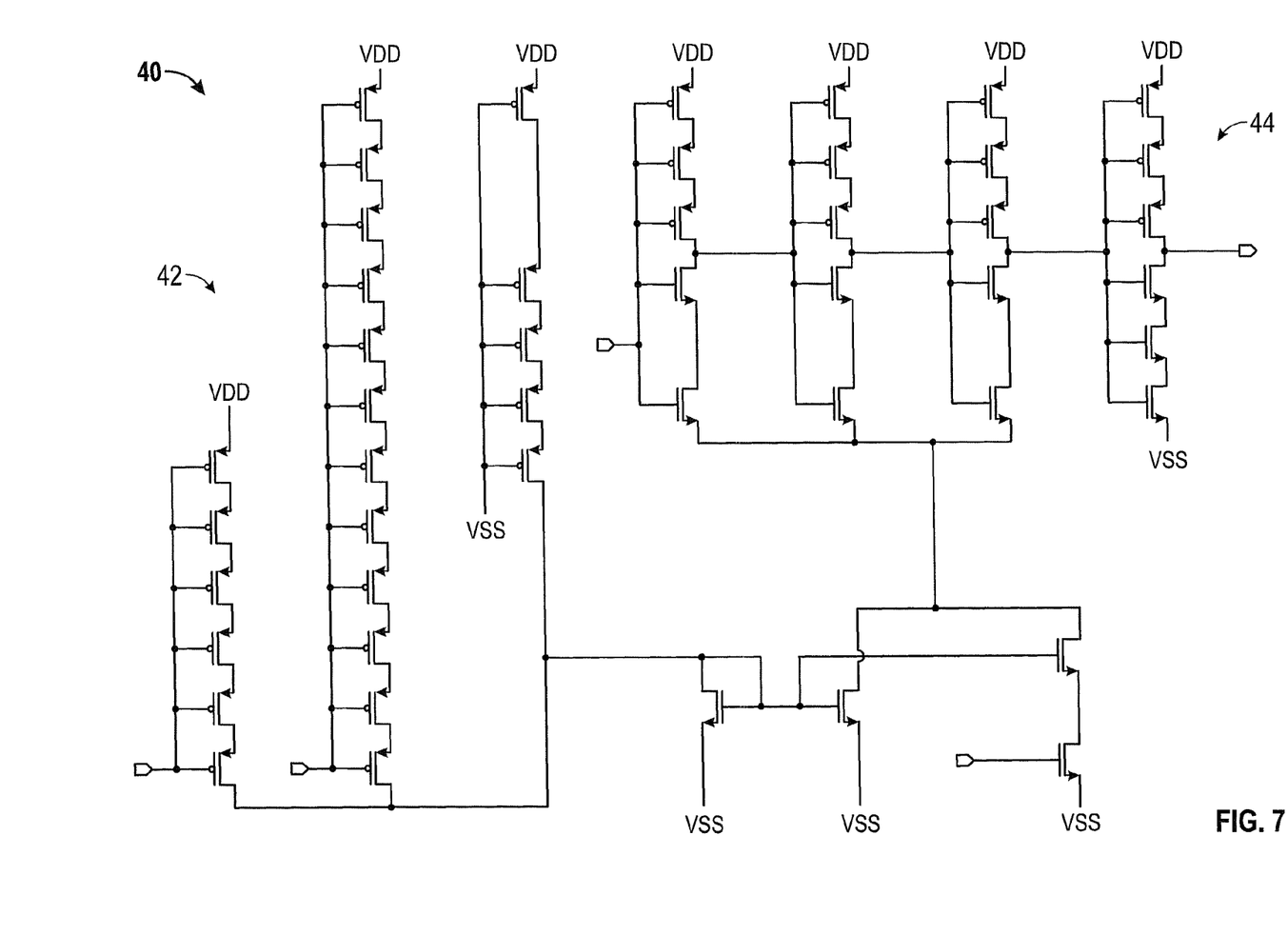
FIG. 7 is a simplified schematic of the interleaved transient filter of FIG. 6, showing one implementation of a delay circuit.
Figure 8:
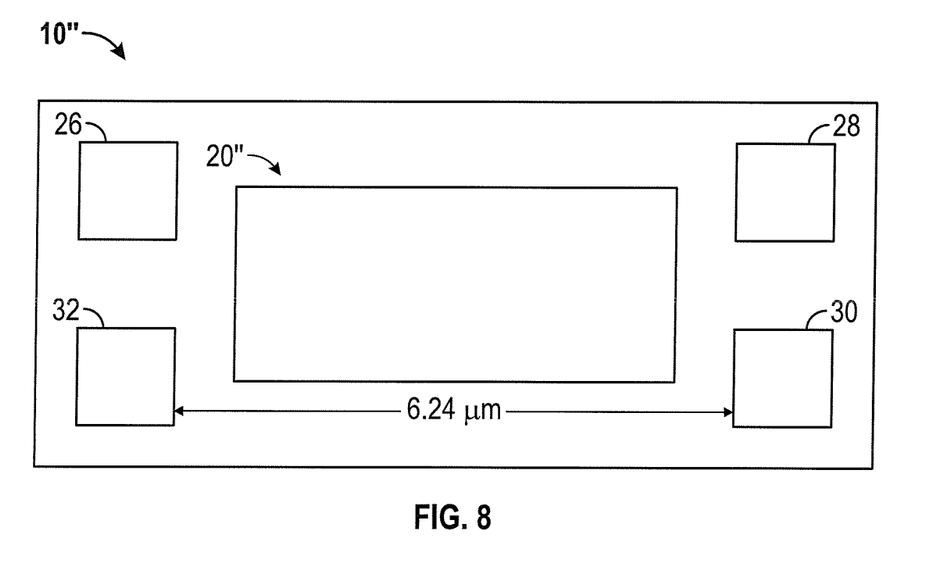
FIG. 8 is a simplified layout showing a position of transistors used in a C-gate for the interleaved transient filter of FIGS. 3 and 4.

Referring now to FIGS. 6-8, another implementation of the filter 10" may be shown. Like the filter 10 and 10', the filter 10" may send an input signal A to an input buffer 14. In the embodiment shown, the input buffer 14 may be formed of a pair of transistors 16 and 18. The pair of transistors 16 and 18 may be complementary MOSFETS. The transistor 16 may be a P-type MOSFET while the transistor 18 may be an N-type MOSFET.

When the input signal A is a high signal, transistor 18 may turn on and send the input signal A along two paths, path 1 having signal A1 and path 2 having signal A2. Similarly, when the input signal A is a low signal, transistor 16 may turn on and send the input signal A along two paths, path 1 having signal A1 and path 2 having signal A2. Path 2 may include a delay element 20". The two signals A1 and A2 along path 1 and path 2 respectively may be sent to inputs 24A and 24B of a logic element 22. The logic element 22 may be a C-gate 22A.

When the signals A1 and A2 sent to inputs 24A and 24B of the C-gate 22A match, the C-gate 22A may act as an inverter. When the signals A1 and A2 sent to inputs 24A and 24B of the C-gate 22A do not match, the C-gate 22A may not drive its output (high impedance state), and the output of the C-gate 22A may maintain its current value.

In the embodiment shown, the C-gate 22A may be comprised of two series PMOS transistors 26, 28 and two series NMOS transistors 30, 32. Each input 24A and 24B of the C-gate 22A controls the gate of one PMOS transistor 26 or 28 and one NMOS transistor 30 or 32. In the embodiment shown, the input 24A can control the gate of PMOS transistor 26 and the gate of NMOS transistor 32. The input 24B can control the gate of PMOS transistor 28 and the gate of NMOS transistor 30.

To generate an SET at an output of the filter 10", a radiation particle would generally have to strike either both series NMOS transistors 30, 32, or both series PMOS transistors 26, 28, depending on the input signal A to the filter 10". The C-gate PMOS transistors 26, 28 and NMOS transistors 30, 32 may be interleaved to provide enough separation to mitigate possible SETs occurring when a radiation particle strikes two transistor sites.

As described above, current SOI technologies may have very thin epitaxial silicon layers on top of the buried oxide (BOX), generally less than 100 nm starting at the 90-nm process node, so the spacing needed to reduce double-node strikes to an acceptable level may be approximately 0.5 microns. This may be attained by interleaving the PMOS transistors 26, 28 and the NMOS transistors 30, 32 in the C-gate 22A. Similar to delay elements 20 and 20', the delay element 20" may be placed between the interleaved PMOS transistors 26, 28, and between the interleaved NMOS transistors 30, 32 in the C-gate 22A, in order to achieve the desired node spacing without any wasted space.

As may be seen in FIGS. 6 and 7, the delay element 20" is a programmable delay element 20C. The programmable delay element 20C may have a programmable delay unit 40 for providing a programmable delay amount. The programmable delay unit 40 may have several transistor stacks 42 and a current mirror 44 that controls the amount of tail current flowing through the programmable delay unit 40. In this embodiment, the filter 10" may be programmed to filter transients of a specific delay, regardless of process, voltage and temperature variability. The programmable delay unit 40 may need a minimum of three programming signals. Two signals, S0 and S1, may be used to control the current bias into the current mirror 44. A third signal, S2, may be used as an additional switch that gives two different configurations of the tail current in the delay element. The design is implemented with transistors of multiple threshold voltages to generate various delay bins.

While embodiments of the disclosure have been described in terms of various specific embodiments, those skilled in the art will recognize that the embodiments of the disclosure may be practiced with modifications within the spirit and scope of the claims.

What is claimed is:

1. An interleaved filter circuit, comprising:
a delay element configured to receive an input signal; and
an interleaved output buffer having a first input which receives the input signal, a second input which receives the output of the delay element, an output of the interleaved output buffer driven when the first input and the second input are at a same logic level, the interleaved output buffer comprising a plurality of interleaved transistors wherein the delay element is positioned between similar channel type transistors of the plurality of interleaved transistors.

2. The interleaved filter circuit in accordance with claim 1, wherein the plurality of interleaved transistors of the interleaved output buffer comprises:
a first pair of transistors coupled to the input signal, wherein the first pair of transistors are a first P-type transistor and a first N-type transistor; and
a second pair of transistors coupled to the output of the delay element, wherein the second pair of transistors are a second P-type transistor and a second N-type transistor;
wherein the first N-type transistor and the second N-type transistor are interleaved wherein the delay element is positioned between the first N-type transistor and the second N-type transistor and the first P-type transistor and the second P-type transistor are interleaved wherein the delay element is positioned between the first P-type transistor and the second P-type transistor.

3. The interleaved filter circuit in accordance with claim 1, wherein the interleaved output buffer comprises:
a first pair of transistors coupled to the input signal, wherein the first pair of transistors are a first PMOSFET and first NMOSFET; and
a second pair of transistors coupled to the output of the delay element, wherein the second pair of transistors are a second PMOSFET and a second NMOSFET;
wherein the first NMOSFET is interleaved with the second NMOSFET so that the delay element is positioned between the first NMOSFET and the second NMOSFET and the first PMOSFET is interleaved with the second PMOSFET so that the delay element is positioned between the first PMOSFET and the second PMOSFET transistor.

4. The interleaved filter circuit in accordance with claim 1, wherein the delay element provides a fixed time delay.

5. The interleaved filter circuit in accordance with claim 1, wherein the delay element provides a programmable time delay.

6. The interleaved filter circuit in accordance with claim 1, wherein the delay element provides a user selected time delay.

7. The interleaved filter circuit in accordance with claim 1, wherein the delay element comprises:
a multiplexer; and
a plurality of cascaded delay elements, an output of each of the plurality of cascaded delay elements coupled to the multiplexer.

8. The interleaved filter circuit in accordance with claim 1, wherein the delay element comprises:
a multiplexer; and
a programmable delay element coupled to the multiplexer, the output of the delay element being determined by a programmable delay amount selected for the programmable delay element.

9. The interleaved filter circuit in accordance with claim 8, wherein the programmable delay element comprises:
a plurality of transistor stacks; and
a current mirror to control an amount of tail current flowing through the programmable delay element.

10. An interleaved filter circuit, comprising:
   a delay element having an input signal and an output signal, the output signal of the delay element being at approximately a same level as the input signal after a predetermined amount of time determined by the delay element;
   an interleaved output buffer having a first input coupled to the input signal, a second input coupled to the output signal of the delay element, an output buffer output signal being driven when the input signal and the output signal of the delay element are at a same logic level;
   wherein the interleaved output buffer comprises:
      a first pair of transistors coupled to the input signal, wherein the first pair of transistors are a first PMOSFET and first NMOSFET; and
      a second pair of transistors coupled to the output of the interleaved output buffer, wherein the second pair of transistors are a second PMOSFET and a second NMOSFET;
      wherein the first NMOSFET is interleaved with the second NMOSFET so that the delay element is positioned between the first NMOSFET and the second NMOSFET and the first PMOSFET is interleaved with the second PMOSFET so that the delay element is positioned between the first PMOSFET and the second PMOSFET.

11. The interleaved filter circuit in accordance with claim 10, wherein the delay element provides a fixed time delay.

12. The interleaved filter circuit in accordance with claim 10, wherein the delay element provides a programmable time delay.

13. The interleaved filter circuit in accordance with claim 10, wherein the delay element provides a user selected time delay.

14. The interleaved filter circuit in accordance with claim 10, wherein the delay element comprises:
   a multiplexer; and
   a plurality of cascaded delay elements, wherein each of the plurality of cascaded delay elements has an output, and wherein the output of each of the plurality of cascaded delay elements is coupled to the multiplexer.

15. The interleaved filter circuit in accordance with claim 10, wherein the delay element comprises:
   a multiplexer; and
   a programmable delay element coupled to the multiplexer, the output of the delay element being determined by a programmable delay amount selected for the programmable delay element.

16. The interleaved filter circuit in accordance with claim 15, wherein the programmable delay element comprises:
   a plurality of transistor stacks; and
   a current mirror to control an amount of tail current flowing through the programmable delay element.

17. A method for filtering Single Event Transients (SETs), the method comprising:
   providing an output buffer having a first pair of transistors wherein the first pair of transistors are a first PMOSFET and first NMOSFET and a second pair of transistors wherein the second pair of transistors are a second PMOSFET and a second NMOSFET, the first and second NMOSFETs being interleaved so that the delay element is positioned between the first NMOSFET and the second NMOSFET, the first and second PMOSFETs being interleaved so that the delay element is positioned between the first PMOSFET and the second PMOSFET;
   sending an input signal to the first pair of transistors;
   sending the input signal which is delayed by a predetermined amount of time to the second pair of transistors; and
   driving an output buffer output signal when the input signal and the delayed input signal are at a same logic level.

18. The method of claim 17, wherein sending the input signal which is delayed by a predetermined amount of time to the second pair of transistors comprises sending the input signal to a delay element.

19. The method of claim 18, wherein the delay element is programmable.

* * * * *